United States Patent
Nin et al.

(10) Patent No.: US 7,898,883 B2
(45) Date of Patent: Mar. 1, 2011

(54) METHOD FOR CONTROLLING ACCESS OF A MEMORY

(75) Inventors: Shu-Liang Nin, Taoyuan County (TW); Wei-Li Liu, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 378 days.

(21) Appl. No.: 12/128,632

(22) Filed: May 29, 2008

(65) Prior Publication Data

US 2009/0175102 A1    Jul. 9, 2009

(30) Foreign Application Priority Data

Jan. 3, 2008  (TW) ............................. 97100191 A

(51) Int. Cl.
*G11C 7/00* (2006.01)
*G11C 8/00* (2006.01)

(52) U.S. Cl. ............. 365/200; 365/230.03; 365/230.06; 365/230.08; 365/240

(58) Field of Classification Search ............ 365/189.05, 365/193, 230.03, 230.06, 230.08, 233.1, 365/233.11, 233.13, 233.5, 240, 200, 185.09, 365/185.11
See application file for complete search history.

(56) References Cited

U.S. PATENT DOCUMENTS

| | | | | |
|---|---|---|---|---|
| 4,991,133 A | | 2/1991 | Davis et al. | |
| 5,678,019 A | * | 10/1997 | Podkowa et al. | 365/230.03 |
| 6,205,516 B1 | * | 3/2001 | Usami | 365/230.06 |
| 6,418,068 B1 | * | 7/2002 | Raynham | 365/230.03 |
| 6,683,817 B2 | * | 1/2004 | Wei et al. | 365/230.03 |
| 6,717,886 B2 | * | 4/2004 | Pramod et al. | 365/193 |
| 6,804,165 B2 | * | 10/2004 | Schrogmeier et al. | 365/233.1 |
| 6,920,080 B2 | * | 7/2005 | Chung et al. | 365/230.08 |
| 6,950,357 B2 | * | 9/2005 | Do | 365/233.11 |
| 6,950,364 B2 | * | 9/2005 | Kim | 365/233.5 |
| 6,957,308 B1 | * | 10/2005 | Patel | 365/239 |
| 7,256,790 B2 | * | 8/2007 | Valmiki et al. | 365/230.03 |
| 7,359,274 B2 | * | 4/2008 | Noguchi et al. | 365/230.03 |
| 7,391,657 B2 | * | 6/2008 | Wallner et al. | 365/230.03 |
| 7,474,585 B2 | * | 1/2009 | Pelly et al. | 365/230.03 |
| 7,502,990 B2 | * | 3/2009 | Zory et al. | 365/230.03 |
| 7,522,468 B2 | * | 4/2009 | Norman | 365/230.03 |
| 7,652,939 B2 | * | 1/2010 | Kim et al. | 365/233.1 |

* cited by examiner

*Primary Examiner*—Trong Phan
(74) *Attorney, Agent, or Firm*—Jianq Chyun IP Office

(57) ABSTRACT

A memory access control method is provided. By decoding a read-write command, a mode register set (MRS) signal is generated. When the MRS signal is enabled, a latch outputs a bank-select signal. The bank-select signal is then decoded to generate a register-select signal. Then, an address signal is written into a register selected by the register-select signal. The value of a certain register can be used to determine whether to enable the error check function. Thus, the next generation memory structure with the CRC function can be compatible with the conventional memory structure.

11 Claims, 3 Drawing Sheets

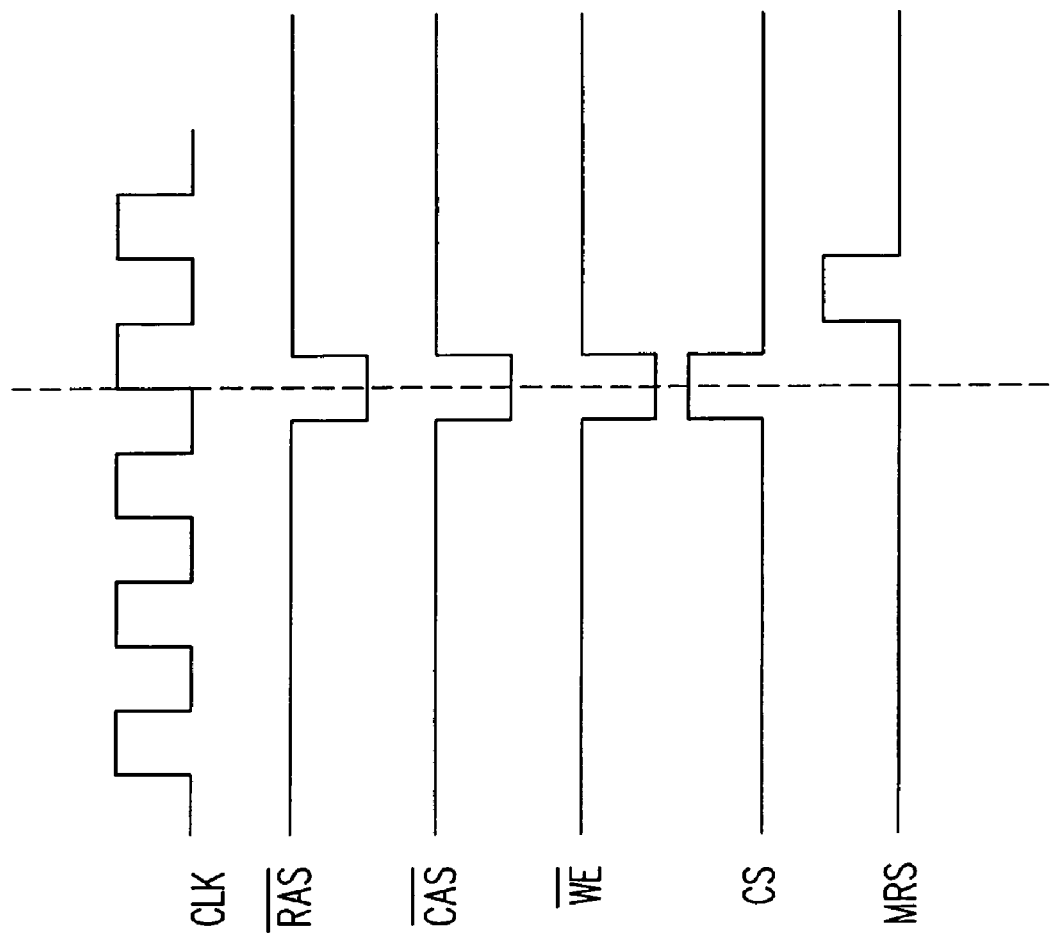

METHOD FOR CONTROLLING ACCESS OF A MEMORY

CROSS-REFERENCE TO RELATED APPLICATION

This application claims the priority benefit of Taiwan application serial no. 97100191, filed on Jan. 3, 2008. The entirety of the above-mentioned patent application is hereby incorporated by reference herein and made a part of specification.

BACKGROUND OF THE INVENTION

1. Field of the Invention

The present invention generally relates to a method for controlling access of a memory, in particular, to a controlling method capable of determining whether to execute cyclic redundancy check (CRC) for the memory.

2. Description of Related Art

In communication systems or computer systems, the CRC can be used to improve the error check capability. After data transmission or data storage, the CRC can be used to check whether an error occurs during the data transmission. During the data transmission, both the receiver and the transmitter must perform the CRC operation, and then one of them compares CRC operation results from both the two parties, so as to know whether an error occurs on received data.

As the data transmission speed of the computer systems becomes increasingly high, the data transmission accuracy cannot be guaranteed by the existed memory structure. Therefore, in the next generation of the memory structure, the CRC function can be applied to the memory access operation, so as to ensure the data transmission accuracy. However, the conventional memory structure is incompatible with the next generation memory structure because of the conventional memory structure without supporting the CRC function.

That is, if the next generation memory structure and the conventional memory structure are used together in a computer system, the CRC function of the next generation memory structure need to be disabled, otherwise a problem may occur on the system operation.

On the other hand, if all memories in the computer system support the CRC function, it is better to enable the CRC function, so as to enhance the system performance.

SUMMARY OF THE INVENTION

Accordingly, the present invention is directed to a method for controlling access of a memory, for solving incompatibility between the memory supporting the CRC function and conventional memory that does not support the CRC function.

According to an aspect of the present invention, a memory control method is provided, which includes: decoding a read-write command to generate a mode register set (MRS) signal; decoding a bank-select signal, when the MRS signal is enabled, so as to generate a register-select signal; selecting at least one register from a plurality of registers according to the register-select signal for writing an address signal to the selected register; and determining whether to enable an error check function or not according to a value of the selected register.

To sum up, in the present invention, if any conventional memory transmission structure that does not support the CRC function is used in computer systems, the CRC function may be turned off, such that the memory compatibility is good enough. Alternatively, if all memories used in a computer system support the CRC function, the CRC function can be turned on, so as to improve the system performance.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a schematic timing chart of a command decoder 200.

DESCRIPTION OF THE EMBODIMENTS

Figure 1:
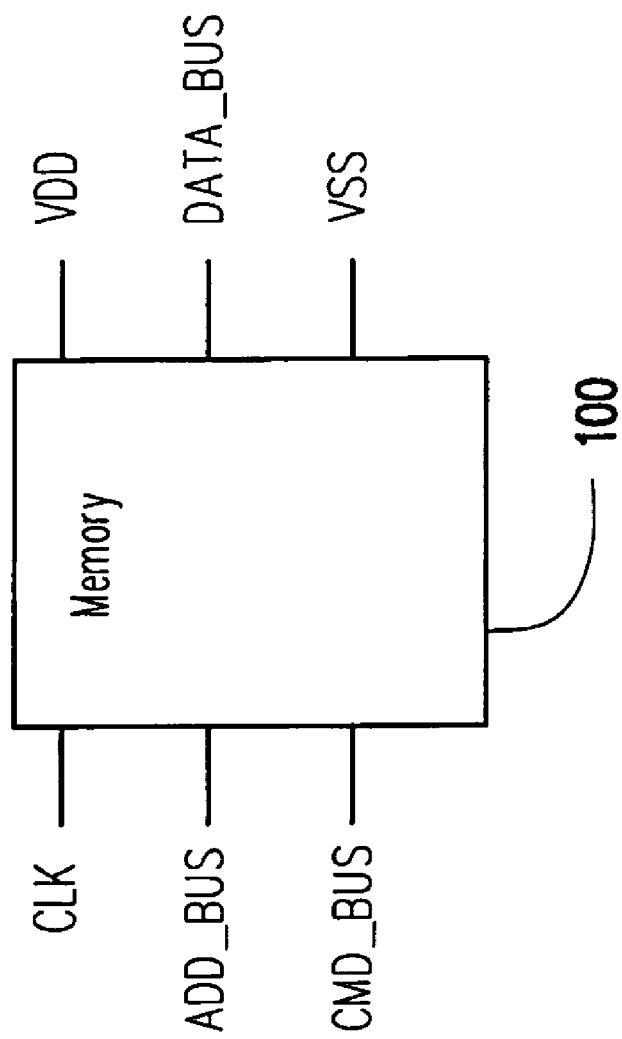
FIG. 1 is a simplified schematic view of a memory 100.

Reference will now be made in detail to the present embodiments of the invention, examples of which are illustrated in the accompanying drawings. Wherever possible, the same reference numbers are used in the drawings and the description to refer to the same or like parts.

According to an embodiment of the present invention, a memory control method and a memory structure are provided, which are capable of determining whether the CRC function is enabled/disabled according to the actual situation. It is better that when all the memory modules in the system can support the CRC function, the CRC function is enabled so as to enhance the system performance. That is, if any memory module in the system cannot support the CRC function, it is better not to enable the CRC function, otherwise an error may occur.

Referring to FIG. 1, it is a simplified schematic view of a memory 100. Definitely, the memory 100 has other I/O pins, but in order to simplify the description, other I/O pins are not shown in the figure.

As shown in FIG. 1, the I/O pins of the memory 100 at least include: an address pin, for receiving address signals on an address bus ADD_BUS; a command pin, for receiving command signals (including the column strobe signal $\overline{CAS}$, the row strobe signal $\overline{RAS}$, the write enable signal $\overline{WE}$, and the chip select signal CS) on a command bus CMD_BUS; power pins, for respectively receiving power sources VDD and VSS; a clock pin, for receiving a clock signal CLK; and a data pin, for receiving data signals on a data bus DATA_BUS.

The memory 100 determines whether to enable the CRC function according to the received address signals and the received command signals. Under the situation that the CRC function is not enabled, an error check operation result CRC_V is not outputted to the data bus DATA_BUS; and under the situation that the CRC function is enabled, the error check operation result CRC_V is outputted to the data bus DATA_BUS.

Figure 2:
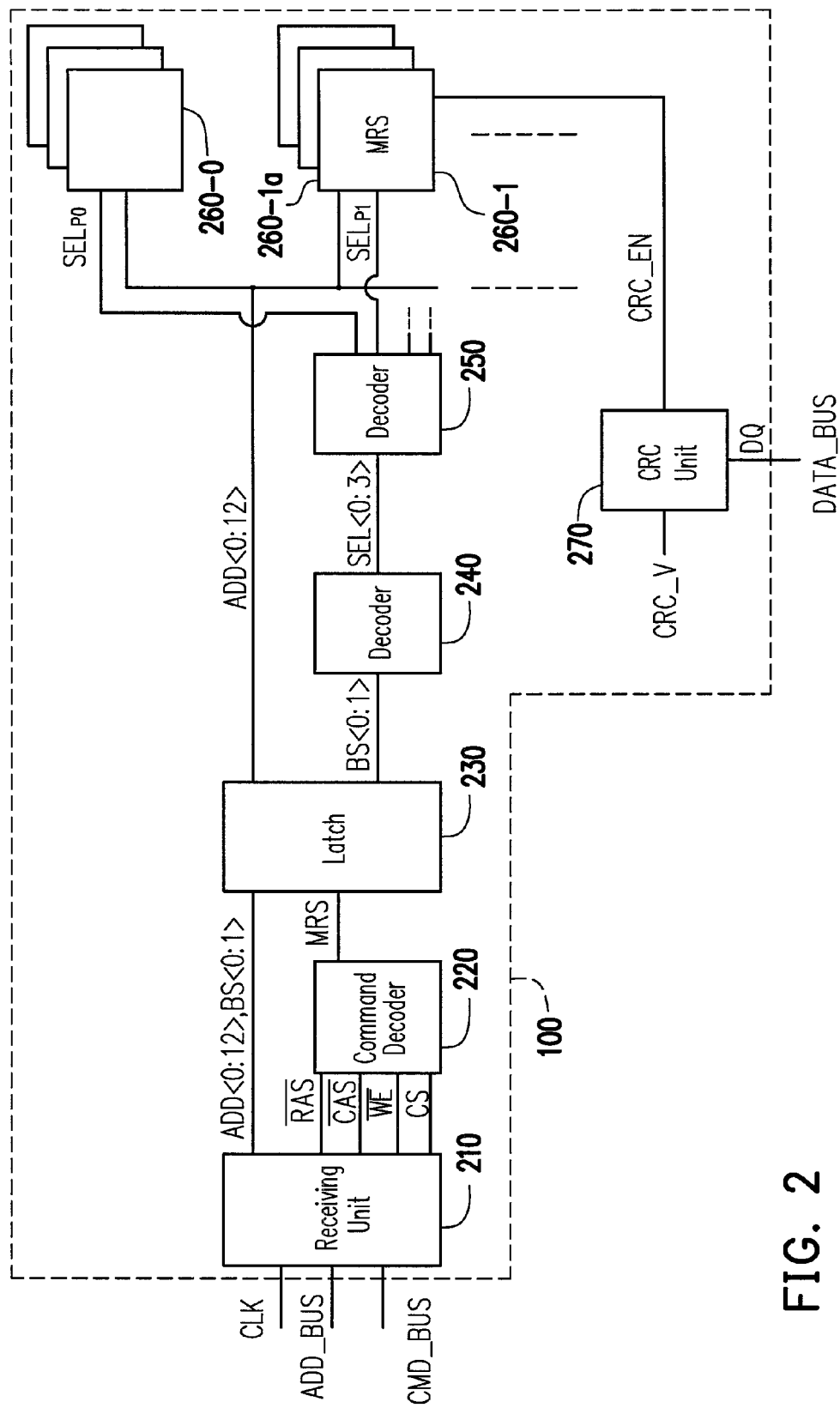
FIG. 2 is a block diagram of a control for a memory 100 according to an embodiment of the present invention.

FIG. 2 is a block diagram for controlling a memory 100 according to an embodiment of the present invention, in which it is determined whether to enable the CRC function. Here, the address signal ADD<0:12> is, for example, 13 bits, and the bank-select signal BS<0:1> is, for example, 2 bits. Definitely, this embodiment is not limited here.

A receiving unit 210 receives the clock signal CLK, the address signals on the address bus ADD_BUS, and the command signals on the command bus CMD_BUS. Particularly, the receiving unit 210 decodes signals on the address bus ADD_BUS into the address signal ADD<0:12> and the bank-select signal BS<0:1>. In addition, the receiving unit 210 decodes the signals on the command bus CMD_BUS to the row address strobe signal $\overline{RAS}$, the column address strobe signal $\overline{CAS}$, the write enable signal $\overline{WE}$, and the chip select signal CS.

The command decoder 220 decodes the row address strobe signal $\overline{RAS}$, The column address strobe signal $\overline{CAS}$, the write enable signal $\overline{WE}$, and the chip select signal CS, and generates one signal which is called mode register set (MRS). The signal MRS is used to enable the latch 230. Referring to FIG. 3, it is a timing chart of the row address strobe signal $\overline{RAS}$, the column Address strobe signal $\overline{CAS}$, the write enable signal $\overline{WE}$, and the signal MRS. As shown in FIG. 3, when the row address strobe signal $\overline{RAS}$, the column address strobe Signal $\overline{CAS}$, and the write enable signal $\overline{WE}$ are all logic low, and the chip elect signal CS is logic high, the signal MRS is enabled. Definitely, this embodiment is not limited here.

The latch 230 may further receive the address signal ADD<0:12> and the bank-select signal BS<0:1>. For example, when the signal MRS is enabled, the latch 230 outputs the latched address signal ADD<0:12> and the latched bank-select signal BS<0:1>.

The decoder 240 decodes the bank-select signal BS<0:1> into a register-select signal SEL<0:3>.

The decoder 250 decodes the register-select signal SEL<0:3> into register-select signals SELp0, SELp1 ... The register-select signals SELp0, SELp1 ... may be used to enable the register groups 260-0, 260-1, and so on respectively.

Here, the register group includes, for example, 13 registers. The address signal ADD<0:12> is written to the enabled register group. For example, when the register group 260-1 is enabled, the address signal ADD<0:12> may be written into 13 registers in the register group 260-1.

In this embodiment, an output value of a certain register may be taken as a CRC function enable signal CRC_EN, so as to control whether to enable the CRC function. The certain register is, for example, a mode register setting (MRS) register 260-1a in the register group 260-1.

A CRC unit 270 may receive a data DQ from the data bus DATA_BUS and perform a CRC operation to the data DQ, so as to generate an error check operation result CRC_V. When the CRC function enable signal CRC_EN is enabled, the CRC unit 270 may be enabled, such that the CRC unit 270 generates the error check operation result CRC_V. On the contrary, when the CRC function enable signal CRC_EN is disabled, the CRC unit 270 may be disabled, such that the CRC unit 270 does not generate the error check operation result CRC_V. Definitely, the CRC function enable signal CRC_EN can also control other I/O circuits in the memory 100, so as to ensure that no error occurs to the data output of the memory 100.

The embodiment of the present invention can be applied to a memory for high speed/bulk data (for example, DDR4), such that it is compatible with the conventional memory structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory control method, comprising the steps of:
   decoding a read-write command to generate a mode register set (MRS) signal;
   decoding a bank-select signal so as to generate a register-select signal, when the mode register set signal is enabled;
   selecting at least one register from a plurality of registers according to the register-select signal, and writing an address signal to the selected at least one register; and
   selectively enabling an error check function according to a value of the at least one selected register.

2. The memory control method according to claim 1, further comprising:
   decoding a signal on an address bus, so as to generate the address signal and the bank-select signal.

3. The memory control method according to claim 1, further comprising:
   decoding a signal on a command bus, so as to generate the read-write command.

4. The memory control method according to claim 2, further comprising:
   decoding a signal on a command bus, so as to generate the read-write command.

5. The memory control method according to claim 3, wherein the read-write command at least comprises a row address strobe signal, a column address strobe signal, a chip select signal, and a write enable signal.

6. The memory control method according to claim 4, wherein the read-write command at least comprises a row address strobe signal, a column address strobe signal, a chip select signal, and a write enable signal.

7. The memory control method according to claim 5, wherein when the row address strobe signal, the column address strobe signal, the chip select signal, and the write enable signal are all logic high, the mode register set signal is enabled.

8. The memory control method according to claim 6, wherein when the row address strobe signal, the column address strobe signal, the chip select signal, and the write enable signal are all logic high, the mode register set signal is enabled.

9. The memory control method according to claim 1 further comprising the steps of:
   latching the address signal and the bank-select signal; and
   outputting the latched address signal and the latched bank-select signal, when the mode register set signal is enabled.

10. The memory control method according to claim 7 further comprising:
    latching the address signal and the bank-select signal; and
    outputting the latched address signal and the latched bank-select signal, when the at least one signal is enabled.

11. The memory control method according to claim 8, further comprising:
    latching the address signal and the bank-select signal; and
    outputting the latched address signal and the latched bank-select signal, when the mode register set signal is enabled.

* * * * *